(12) United States Patent
Takata

(10) Patent No.: US 11,258,428 B2
(45) Date of Patent: Feb. 22, 2022

(54) FILTER DEVICE AND MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 97 days.

(21) Appl. No.: 16/886,829

(22) Filed: May 29, 2020

(65) Prior Publication Data

US 2020/0295735 A1    Sep. 17, 2020

Related U.S. Application Data

(63) Continuation of application No. PCT/JP2018/045373, filed on Dec. 10, 2018.

(30) Foreign Application Priority Data

Dec. 13, 2017 (JP) .............................. JP2017-238305

(51) Int. Cl.
*H03H 9/64* (2006.01)
*H03H 9/145* (2006.01)
*H03H 9/05* (2006.01)

(52) U.S. Cl.
CPC ........ *H03H 9/6483* (2013.01); *H03H 9/0585* (2013.01); *H03H 9/14538* (2013.01)

(58) Field of Classification Search
CPC ...... H03H 9/64; H03H 9/145; H03H 9/14538; H03H 9/72
See application file for complete search history.

(56) References Cited

U.S. PATENT DOCUMENTS

| 5,914,646 A  * | 6/1999 | Hashimoto .......... H03H 9/1071 333/195 |
| 6,717,487 B2 * | 4/2004 | Takata ................. H03H 9/6483 333/133 |

(Continued)

FOREIGN PATENT DOCUMENTS

| JP | 2011-114826 A | 6/2011 |
| JP | 2013-123270 A | 6/2013 |

(Continued)

OTHER PUBLICATIONS

Official Communication issued in International Patent Application No. PCT/JP2018/045373, dated Mar. 5, 2019.

*Primary Examiner* — Dean O Takaoka
(74) *Attorney, Agent, or Firm* — Keating & Bennett, LLP

(57) ABSTRACT

A filter device utilizing surface acoustic waves includes one or more series arm resonators connected to each other along a path between a first input/output terminal and a second input/output terminal, and three or more parallel arm resonators each connected between a connection node provided on the path and ground and defining the pass band of the filter device. Parallel arm resonators having different anti-resonant frequencies from each other are included. Parallel arm resonators among the three or more parallel arm resonators are connected to the same connection node provided along the path. Remaining parallel arm resonators are connected to different connection nodes from the same connection node. The anti-resonant frequencies of the parallel arm resonators connected to the same connection node are identical and are the lowest anti-resonant frequencies among the anti-resonant frequencies of the three or more parallel arm resonators.

20 Claims, 8 Drawing Sheets

(56) References Cited

U.S. PATENT DOCUMENTS

| | | | | |
|---|---|---|---|---|
| 6,975,185 | B2 * | 12/2005 | Tsutsumi | H03H 9/6483 |
| | | | | 333/193 |
| 6,995,631 | B2 * | 2/2006 | Taniguchi | H03H 9/6496 |
| | | | | 333/133 |
| 7,049,908 | B2 * | 5/2006 | Takata | H03H 9/6483 |
| | | | | 333/193 |
| 9,148,119 | B2 * | 9/2015 | Iwaki | H03H 9/6436 |
| 2012/0274421 | A1 | 11/2012 | Hara et al. | |
| 2014/0266510 | A1 | 9/2014 | Silver et al. | |
| 2016/0126932 | A1 | 5/2016 | Nakai et al. | |
| 2017/0117873 | A1 | 4/2017 | Takata | |
| 2018/0013405 | A1 | 1/2018 | Takata | |

FOREIGN PATENT DOCUMENTS

| | | |
|---|---|---|
| JP | 2017-085262 A | 5/2017 |
| JP | 2017-195580 A | 10/2017 |
| JP | 2017-201825 A | 11/2017 |
| WO | 2014/196245 A1 | 12/2014 |
| WO | 2016/174938 A1 | 11/2016 |

* cited by examiner

FILTER DEVICE AND MULTIPLEXER

CROSS REFERENCE TO RELATED APPLICATIONS

This application claims the benefit of priority to Japanese Patent Application No. 2017-238305 filed on Dec. 13, 2017 and is a Continuation Application of PCT Application No. PCT/JP2018/045373 filed on Dec. 10, 2018. The entire contents of each application are hereby incorporated herein by reference.

BACKGROUND OF THE INVENTION

1. Field of the Invention

The present invention relates to a filter device and a multiplexer.

2. Description of the Related Art

Generally, a ladder filter in which resonators are connected in multiple stages is used as a band pass filter (for example, refer to Japanese Unexamined Patent Application Publication No. 2011-114826). This kind of ladder filter is designed so that the resonant frequencies of the series arm resonators and the anti-resonant frequencies of the parallel arm resonators are located near the center frequency of the pass band of the ladder filter. Furthermore, the ladder filter is designed so that the anti-resonant frequencies of the series arm resonators are located at an attenuation pole near the high-frequency side of the pass band and the resonant frequencies of the parallel arm resonators are located at an attenuation pole near the low-frequency side of the pass band. In this way, the pass band is formed.

In recent years, the demand for higher capacity and higher speed communication has led to a demand for band pass filters having wider pass bands. Therefore, a wider passband is achieved by making the anti-resonant frequencies of the plurality of parallel arm resonators of the ladder filter different from each other.

However, when the anti-resonant frequencies of the plurality of parallel arm resonators are made different from each other, there is a problem in that the insertion loss is degraded particularly at the high-frequency side inside the pass band.

SUMMARY OF THE INVENTION

Preferred embodiments of the present invention provide filter devices that are each able to achieve a wider bandwidth while reducing or preventing degradation of insertion loss.

A filter device according to a preferred embodiment of the present invention utilizes surface acoustic waves. The filter device includes one or more series arm resonators that are connected to each other along a path connected between a first input/output terminal and a second input/output terminal; and three or more parallel arm resonators that are each connected between a connection node provided on the path and ground and that define the pass band of the filter device. The three or more parallel arm resonators include parallel arm resonators having different anti-resonant frequencies from each other. Two or more parallel arm resonators among the three or more parallel arm resonators are connected to the same connection node provided on the path. The other parallel arm resonators are connected to connection nodes that are different from that connection node. The anti-resonant frequencies of the two or more parallel arm resonators are the same or substantially the same and are the lowest anti-resonant frequencies among the anti-resonant frequencies of the three or more parallel arm resonators.

The plurality of parallel arm resonators that define the pass band of the filter device that utilizes surface acoustic waves (SAWs) are resonators that utilize SAWs. The parallel arm resonators utilizing SAWs each generate a ripple resulting from the stop band (stop band ripple) due to the characteristics thereof. When the anti-resonant frequencies of the parallel arm resonators that define the pass band are different from each other in order to widen the pass band, some of the parallel arm resonators will have anti-resonant frequencies that are located at the low- and high-frequency sides of the pass band rather than at the center frequency of the pass band. Regarding a parallel arm resonator whose anti-resonant frequency is located at the low-frequency side of the pass band, the frequency at which the stop band ripple is generated also becomes lower in accordance with the amount by which the anti-resonant frequency is moved toward the low-frequency side and consequently the stop band ripple may be generated near the high-frequency side of the pass band. Therefore, the insertion loss is particularly degraded at the high-frequency side inside the pass band.

Accordingly, two or more parallel arm resonators that have the lowest anti-resonant frequency among the three or more parallel arm resonators that define the pass band of the filter device are connected to the same connection node. The two or more parallel arm resonators may generate a stop band ripple near the high-frequency side of the pass band of the filter device as described above. In this case, the frequency at which the stop band ripple is generated can be moved away from the pass band of the filter device without significantly changing the bandpass characteristic of the filter device compared to the case where one parallel arm resonator is connected to that connection node. In addition, the interval between the anti-resonant frequency and the frequency of the stop band ripple are able to be widened and the frequency at which the stop band ripple is generated is able to be moved away from the pass band of the filter device by making the anti-resonant frequencies of the two or more parallel arm resonators the same or substantially the same as each other.

In this way, the two or more parallel arm resonators are able to generate a stop band ripple at a higher frequency than the frequency of a stop band ripple that would be generated by one parallel arm resonator if one parallel arm resonator were connected to that connection node while forming the pass band in the same manner.

Thus, the frequency of the stop band ripple generated near the pass band of the filter device is able to be shifted toward the high-frequency side, and therefore the bandwidth is able to be increased while reducing or preventing degradation of insertion loss.

Furthermore, the other parallel arm resonators may include two or more parallel arm resonators connected to different connection nodes provided along the path.

When a plurality of parallel arm resonators are connected to the same connection node, the Q value at the anti-resonant frequency of the plurality of parallel arm resonators is degraded. In the above configuration, since two or more other parallel arm resonators, except for the above-described two or more parallel arm resonators, are not connected to the same connection node, the number of parallel arm resonators having degraded Q values at the anti-resonant frequencies thereof is able to be reduced, and therefore degradation of the insertion loss is able to be more effectively reduced or prevented.

Furthermore, electrostatic capacitances of the two or more parallel arm resonators may be smaller than electrostatic capacitances of a remainder of the parallel arm resonators.

The smaller the electrostatic capacitances (i.e., the larger the impedances) of the parallel arm resonators, the more the degradation of the insertion loss is able to be reduced or prevented and the more the effect of the degradation of the Q value at the anti-resonant frequency is able to be reduced or prevented. Therefore, the effect of the degradation of the Q values is able to be reduced or prevented by reducing the electrostatic capacitances of two or more parallel arm resonators that are connected to the same connection node and have degraded Q values at the anti-resonant frequencies thereof.

In addition, the one or more series arm resonators and the three or more parallel arm resonators may define a ladder filter.

With this configuration, a wider bandwidth is able to be achieved while reducing or preventing degradation of insertion loss in a ladder filter in which a large number of parallel arm resonator are connected to each other.

Furthermore, each resonator of the one or more series arm resonators and the three or more parallel arm resonators may include an IDT electrode including a pair of comb-shaped electrodes provided on a substrate including a piezoelectric layer. The substrate may include a piezoelectric layer including the IDT electrode provided on one main surface thereof, a high-acoustic-velocity support substrate in which an acoustic velocity of a propagating bulk wave is higher than an acoustic velocity of an acoustic wave propagating along the piezoelectric layer, and a low-acoustic-velocity film provided between the high-acoustic-velocity support substrate and the piezoelectric layer and in which an acoustic velocity of a propagating bulk wave is lower than an acoustic velocity of a bulk wave propagating along the piezoelectric layer.

Thus, the Q value of each resonator including an IDT electrode provided on a substrate including a piezoelectric layer is able to be maintained at a high value.

In addition, a multiplexer according to a preferred embodiment of the present invention includes a plurality of filters including a filter device according to a preferred embodiment of the present invention, one input/output terminal of each of the plurality of filters being directly or indirectly connected to a common connection point.

According to this preferred embodiment of the present invention, a multiplexer is provided that is able to achieve a wider bandwidth while reducing or preventing degradation of insertion loss.

The filter devices and multiplexers according to preferred embodiments the present invention are each capable of achieving a wider bandwidth while reducing or preventing degradation of insertion loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
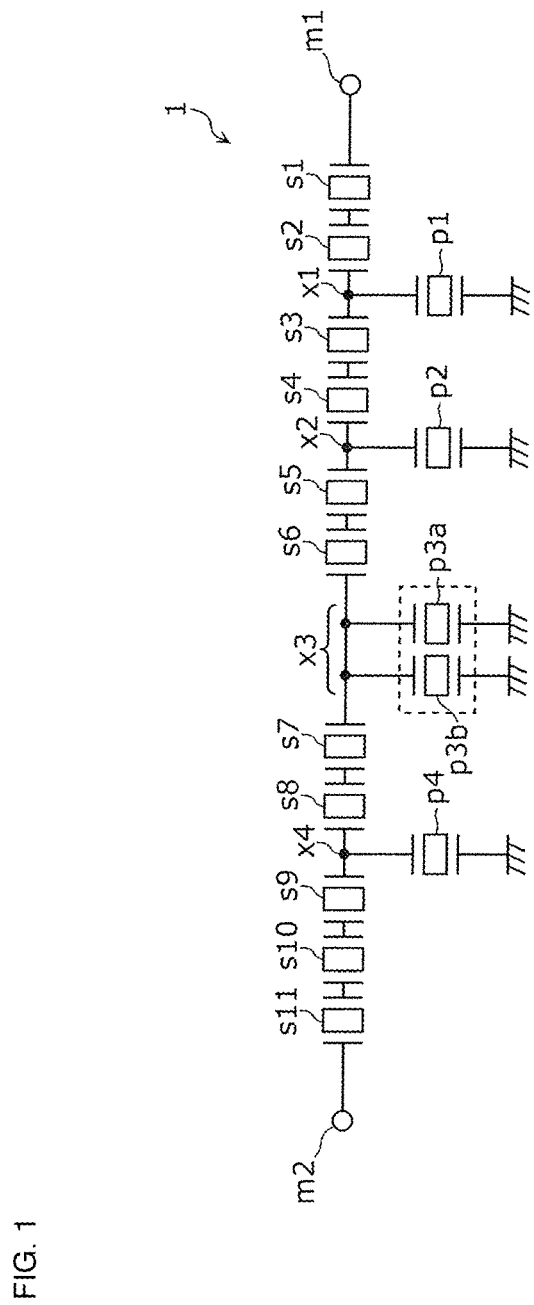
FIG. 1 is a circuit configuration diagram of a filter device according to a preferred embodiment of the present invention.

Hereafter, preferred embodiments of the present invention will be described in detail with reference to the drawings. The preferred embodiments described hereafter each illustrate a comprehensive or specific example of the present invention. The numerical values, shapes, materials, elements, arrangement of the elements, the ways in which the elements are connected to each other and so forth described in the following preferred embodiments are merely examples and are not intended to limit the present invention. Elements not described in the independent claims among elements in the following preferred embodiments are described as arbitrary or optional elements. Furthermore, in the drawings, portions of configurations that are the same or substantially the same as each other are denoted by the same symbols and repeated description thereof may be omitted or simplified.

PREFERRED EMBODIMENT

1. Configuration of Filter Device

First, the configuration of a filter device according to a preferred embodiment will be described using FIG. 1.

FIG. 1 is a circuit configuration diagram of a filter device 1 according to the present preferred embodiment.

The filter device 1 includes one or more series arm resonators that are connected to each other along a path connected between an input/output terminal m1 (first input/output terminal) and an input/output terminal m2 (second input/output terminal) and three or more parallel arm resonators that are connected between connection nodes provided on the path and ground. The one or more series arm resonators and the three or more parallel arm resonators define a ladder filter, for example. Each connection node is a connection point between an element and an element or between an element and a terminal and are illustrated as points indicated by x1 to x4 in FIG. 1. The filter device 1 utilizes surface acoustic waves and the one or more series arm resonators and the three or more parallel arm resonators utilize SAWs.

The filter device 1 includes serially connected series arm resonators s1 to s11 as the one or more series arm resonators. Furthermore, as the three or more parallel arm resonators, the filter device 1 includes a parallel arm resonator p1 connected between ground and a connection node x1 between the series arm resonators s2 and s3, a parallel arm resonator p2 connected between ground and a connection node x2 between the series arm resonators s4 and s5, parallel-connected parallel arm resonators p3a and p3b connected between ground and the same connection node x3 between the series arm resonators s6 and s7, and a parallel arm resonator p4 connected between ground and a connection node x4 between the series arm resonators s8 and s9. Here, the connection node X3 may be one point on the path, or, as illustrated in FIG. 1, when two different points are arranged on the path without any resonators or elements located therebetween, the two points will have the same potential and are therefore interpreted as "the same connection node". Thus, two or more parallel arm resonators (parallel arm resonators p3a and p3b) among the three or more parallel arm resonators (parallel arm resonator p1, p2, p3a, p3b, and p4) are connected to the same connection node x3 provided on the path and the other parallel arm resonators (parallel arm resonators p1, p2, and p4) are connected to different connection nodes from the connection node x3.

Furthermore, the other parallel arm resonators (parallel arm resonators p1, p2, and p4) include two or more parallel arm resonators and are connected to different connection nodes provided along the path. "Different connection nodes" refer to different points along the path with resonators or elements interposed therebetween. Therefore, no other parallel arm resonators are connected in parallel with the parallel arm resonators p1, p2, and p4, and only one parallel arm resonator is connected to each of the connection nodes x1, x2, and x4.

The one or more series arm resonators (series arm resonators s1 to s11) and the three or more parallel arm resonators (parallel arm resonators p1, p2, p3a, p3b, and p4) that define the filter device 1 preferably utilize surface acoustic waves, for example. Each resonator among the one or more series arm resonators and the three or more parallel arm resonators includes an IDT electrode including a pair of comb-shaped electrodes provided on a substrate including a piezoelectric layer (substrate having piezoelectricity). Consequently, the filter device 1 can be provided using IDT electrodes provided on a substrate having piezoelectricity, and therefore a compact low-profile filter can be obtained that has a bandpass characteristic having a high degree of steepness. A substrate having piezoelectricity has piezoelectricity at at least the surface thereof. The substrate includes a piezoelectric layer that includes the IDT electrodes provided on one main surface thereof, a high-acoustic-velocity support substrate in which the acoustic velocity of a propagating bulk wave is higher than the acoustic velocity of an acoustic wave propagating along the piezoelectric layer, and a low-acoustic-velocity film between the high-acoustic-velocity support substrate and the piezoelectric layer and in which the acoustic velocity of a propagating bulk wave is lower than the acoustic velocity of an acoustic wave propagating along the piezoelectric layer. The substrate may instead exhibit piezoelectricity throughout the entirety thereof.

2. Resonator Structure

Hereafter, the structure of the resonators of the filter device 1 will be described in more detail by focusing on an arbitrary resonator. The other resonators have the same or substantially the same structure as the arbitrary resonator, and therefore detailed description thereof is omitted.

Figure 2:
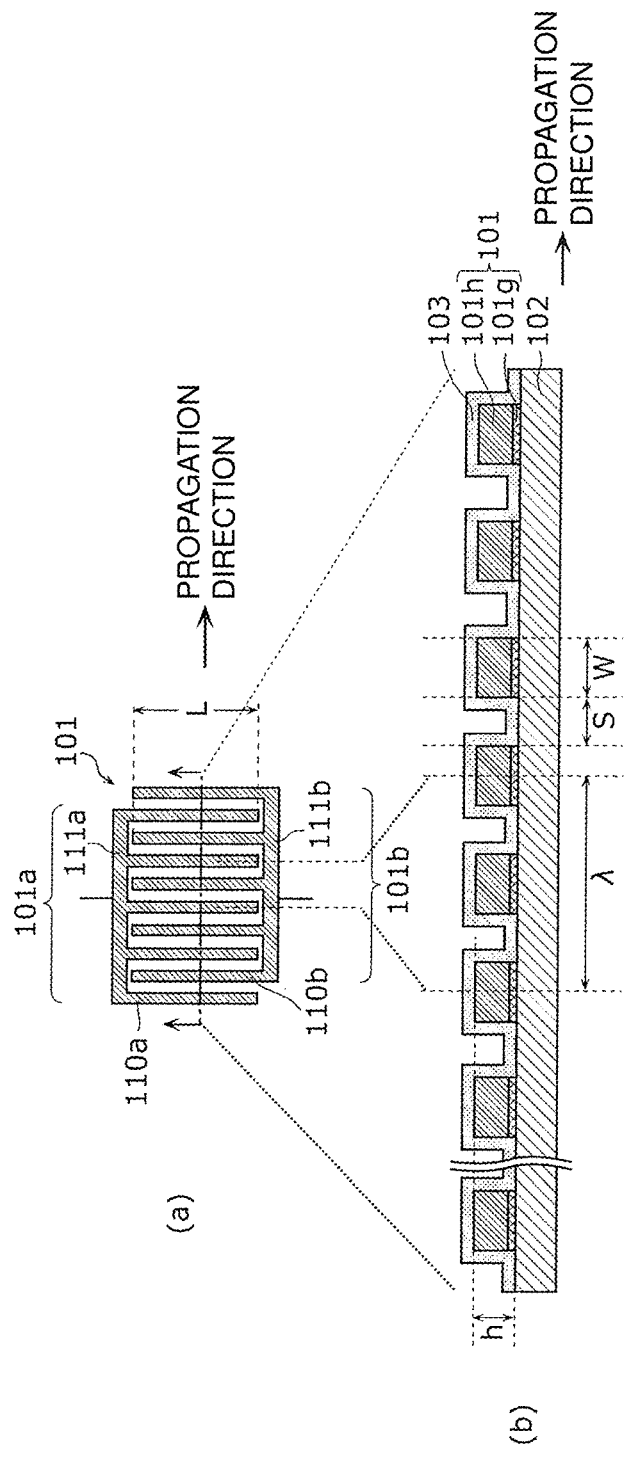
FIG. 2 is a diagram schematically illustrating the structure of resonators in a preferred embodiment of the present invention.

FIG. 2 schematically illustrates an example of the structure of the resonators in the present preferred embodiment, where part (a) is a plan view and part (b) is a sectional view of part (a). The resonator illustrated in FIG. 2 is to explain the typical structure of the resonators of the filter device 1. Therefore, the number, the length, and so forth of the electrode fingers of the IDT electrode of each resonator of the filter device 1 are not limited to the number, the length, and so forth of the electrode fingers of the IDT electrode illustrated in the figure. In FIG. 2, illustration of the reflectors of the resonator is omitted.

As illustrated in parts (a) and (b) of FIG. 2, the resonator includes an IDT electrode 101, a piezoelectric substrate 102 on which the IDT electrode 101 is provided, and a protective layer 103 that covers the IDT electrode 101. Hereafter, these elements will be described in detail.

As illustrated in part (a) of FIG. 2, a pair of comb-shaped electrodes 101a and 101b, which define the IDT electrode 101 and face each other, are provided on the piezoelectric substrate 102. The comb-shaped electrode 101a includes a plurality of electrode fingers 110a, which are parallel or substantially parallel to each other, and a busbar electrode 111a that connects the plurality of electrode fingers 110a to each other. Furthermore, the comb-shaped electrode 101b includes a plurality of electrode fingers 110b, which are parallel or substantially parallel to each other, and a busbar electrode 111b that connects the plurality of electrode fingers 110b to each other. The plurality of electrode fingers 110a and 110b extend in a direction that is perpendicular or substantially perpendicular to a propagation direction.

The comb-shaped electrodes 101a and 101b may also be individually referred to as IDT electrodes. However, hereafter, for convenience, description will be provided while assuming that the one IDT electrode 101 includes the pair of comb-shaped electrodes 101a and 101b.

In addition, as illustrated in part (b) of FIG. 2, the IDT electrode 101, which includes the plurality of electrode fingers 110a and 110b and the busbar electrodes 111a and 111b, has a multilayer structure including an adhesive layer 101g and a main electrode layer 101h.

The adhesive layer 101g improves adhesion between the piezoelectric substrate 102 and the main electrode layer 101h, and for example, Ti is preferably used as the material thereof.

For example, Al including about 1% Cu is preferably used as the material of the main electrode layer 101h.

The piezoelectric substrate 102 is a substrate on which the IDT electrode 101 is provided, and is preferably, for example, made of a $LiTaO_3$ piezoelectric single crystal, a $LiNbO_3$ piezoelectric single crystal, a $KNbO_3$ piezoelectric single crystal, quartz, or a piezoelectric ceramic.

The protective layer 103 covers the comb-shaped electrodes 101a and 101b. The purpose of the protective layer 103 is to protect the main electrode layer 101h from the outside environment, adjust the frequency-temperature characteristic, increase moisture resistance, and so forth, and for example, the protective layer 103 preferably includes silicon dioxide as a main component.

The structure of each resonator of the filter device 1 is not limited to the structure illustrated in FIG. 2. For example, the IDT electrode 101 may have a multilayer structure including metal films or may include a single metal film layer. In addition, the materials used for the adhesive layer 101g, the main electrode layer 101h, and the protective layer 103 are not limited to the above-described materials. Furthermore, for example, the IDT electrode 101 may be made of a metal such as Ti, Al, Cu, Pt, Au, Ag, or Pd or an alloy of such a metal, and may include a plurality of multilayer bodies made of such metals or alloys. In addition, the protective layer 103 does not have to be provided.

In the resonator (acoustic wave resonator), the wavelength of an excited acoustic wave is determined by the design parameters and so forth of the IDT electrode 101. In other words, the resonant frequency and the anti-resonant frequency of the resonator are determined by the design parameters and so forth of the IDT electrode 101. Hereafter, the design parameters of the IDT electrode 101, i.e., the design parameters of the comb-shaped electrode 101a and the comb-shaped electrode 101b will be described.

The wavelength of an acoustic wave is determined by a repeating period λ of the plurality of electrode fingers 110a or 110b of the comb-shaped electrode 101a or 101b illustrated in FIG. 2. Furthermore, the electrode pitch (electrode period) is about ½ the repeating period λ, and is defined by (W+S), where W is the line width of the electrode fingers 110a and 110b of the comb-shaped electrodes and 101a and 101b and S is the width of a space between adjacent electrode fingers 110a and 110b. In addition, as illustrated in part (a) of FIG. 2, a cross width L of the IDT electrode 101 is an electrode finger length over which the electrode fingers 110a of the comb-shaped electrode 101a and the electrode fingers 110b of the comb-shaped electrode 101b overlap when viewed in the propagation direction of an acoustic wave. In addition, an electrode duty (duty ratio) is a line width occupation ratio of the plurality of electrode fingers 110a and 110b, and is defined by the ratio of the line width of the plurality of electrode fingers 110a and 110b with respect to the sum of the line width of the plurality of electrode fingers 110a and 110b and the space width, i.e., W/(W+S). Furthermore, the term "number of pairs" refers to the number of electrode fingers 110a and electrode fingers 110b of the comb-shaped electrodes 101a and 101b that define pairs, and is roughly half the total number of electrode fingers 110a and electrode fingers 110b. For example, M=2N or M=2N+1 is preferably satisfied, where N is the number of pairs and M is the total number of electrode fingers 110a and electrode fingers 110b. In addition, the film thickness of the IDT electrode 101 is a thickness h of the plurality of electrode fingers 110a and 110b.

3. Filter Characteristics

Next, the filter characteristics of filter devices of an example of a preferred embodiment of the present invention, a comparative example 1, and a comparative example 2 will be described. The pass band of the filter devices of the example, comparative example 1, and comparative example 2 is, for example, Band 25Tx (about 1850 MHz—about 1915 MHz) of long term evolution (LTE), which has a relatively wide pass band width.

The filter device of the example is the filter device 1 and anti-resonant frequencies, numbers of pairs, cross widths, and electrostatic capacitances, as the resonator parameters of the parallel arm resonators p1, p2, p3a, p3b, and p4, are listed in Table 1.

TABLE 1

|  | Example | | | | |
|---|---|---|---|---|---|
|  | p1 | p2 | p3a | p3b | p4 |
| Anti-Resonant Frequencies | 1800 MHz | 1794 MHz | 1783 MHz | 1783 MHz | 1803 MHz |
| Numbers of Pairs | 147 | 172 | 43 | 43 | 187 |
| Cross Widths | 31.6 μm | 31.8 μm | 2.7 μm | 2.7 μm | 31.6 μm |
| Electrostatic Capacitances | 2.02 pF | 2.37 pF | 0.50 pF | 0.50 pF | 2.57 pF |

As illustrated in Table 1, parallel arm resonators having different anti-resonant frequencies from each other are included among the parallel arm resonators p1, p2, p3a, p3b, and p4. In addition, the anti-resonant frequencies of the parallel arm resonators p3a and p3b are the same or substantially the same as each other and are the lowest anti-resonant frequencies among the anti-resonant frequencies of the parallel arm resonators p1, p2, p3a, p3b, and p4. The meaning of "the same or substantially the same" is intended to include not only perfectly identical but also substantially identical. For example, "substantially identical" means that the difference between one anti-resonant frequency and another anti-resonant frequency is within about 0.05% of the one anti-resonant frequency. Specifically, in the case where the anti-resonant frequency of the parallel arm resonator p3a is about 2000 MHz, even if the anti-resonant frequency of the parallel arm resonator p3b is about 1999 MHz or about 2001 MHz, the anti-resonant frequencies of the parallel arm resonators p3a and p3b are considered to be substantially identical. The parallel arm resonators p3a and p3b have the same or substantially the same anti-resonant frequency due to their respective electrode finger pitches being the same or substantially the same. Furthermore, as illustrated in Table 1, the electrostatic capacitances of the parallel arm resonators p3a and p3b are the smallest among the electrostatic capacitances of the parallel arm resonators p1, p2, p3a, p3b, and p4. The electrostatic capacitances of the parallel arm resonators p3a and p3b are, for example, about 0.5 pF and are the same or substantially the same as each other, but may instead be different from each other.

The circuit configuration of the filter device of comparative example 1 is different from that of the filter device 1 illustrated in FIG. 1.

Figure 3:
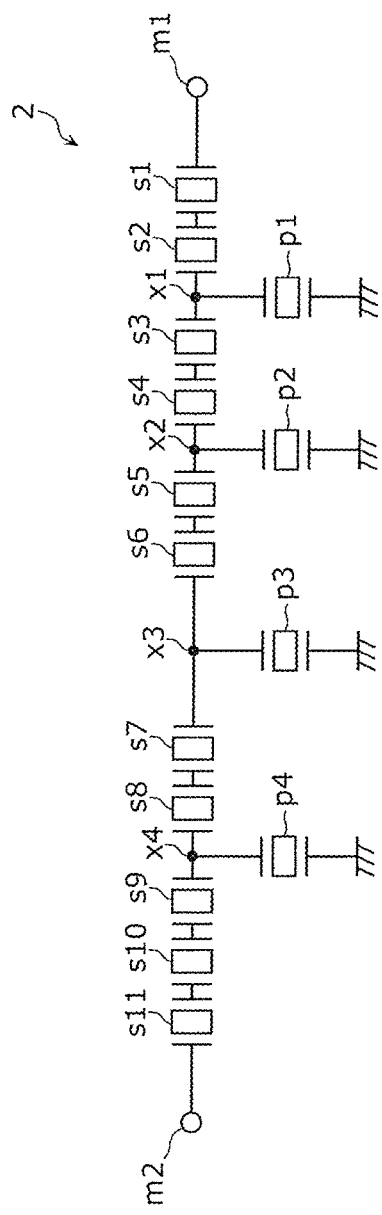
FIG. 3 is a circuit configuration diagram of a filter device according to a comparative example 1.

FIG. 3 is a circuit configuration diagram of a filter device 2 according to comparative example 1.

The filter device 2 differs from the filter device 1 in that only one parallel arm resonator p3 is connected to the connection node x3. In other words, in the filter device 2, two parallel arm resonators p3a and p3b are not connected to the same connection node x3. The rest of the configuration is the same or substantially the same as that of filter device 1 and description thereof is omitted. The resonator parameters of the parallel arm resonators p1, p2, p3, and p4 of the filter device 2 are listed in Table 2.

TABLE 2

| | Comparative Example 1 | | | |
|---|---|---|---|---|
| | p1 | p2 | p3 | p4 |
| Anti-Resonant Frequencies | 1800 MHz | 1794 MHz | 1783 MHz | 1803 MHz |
| Numbers of Pairs | 147 | 172 | 86 | 187 |
| Cross Widths | 31.6 μm | 31.8 μm | 27 μm | 31.6 μm |
| Electrostatic Capacitances | 2.02 pF | 2.37 pF | 1.00 pF | 2.57 pF |

As illustrated in Tables 1 and 2, the numbers of pairs in the parallel arm resonators p3a and p3b in the example are different from the number of pairs in the parallel arm resonator p3 in comparative example 1. Specifically, the number of pairs in each of the parallel arm resonators p3a and p3b is half the number of pairs of the parallel arm resonator p3 and consequently, the electrostatic capacitance of each of the parallel arm resonators p3a and p3b is about half the electrostatic capacitance of the parallel arm resonator p3. In other words, the parallel arm resonators p3a and p3b can be considered as being resonators obtained by dividing the parallel arm resonator p3 into two resonators and connecting the two resonators in parallel with each other. However, as will be described in detail later, the electrode pitch of each of the parallel arm resonators p3a and p3b is smaller than the electrode pitch of the parallel arm resonator p3.

The circuit configuration of filter device of comparative example 2 is the same or substantially the same as that of the filter device 1 illustrated in FIG. 1, but the anti-resonant frequencies of the parallel arm resonators p3a and p3b are different from those in the example. The resonator parameters of the parallel arm resonators p1, p2, p3a, p3b, and p4 of the filter device of comparative example 2 are illustrated in Table 3.

TABLE 3

| | Comparative Example 2 | | | | |
|---|---|---|---|---|---|
| | p1 | p2 | p3a | p3b | p4 |
| Anti-Resonant Frequencies | 1800 MHz | 1794 MHz | 1780 MHz | 1786 MHz | 1803 MHz |
| Numbers of Pairs | 147 | 172 | 43 | 43 | 187 |
| Cross Widths | 31.6 μm | 31.8 μm | 27 μm | 27 μm | 31.6 μm |
| Electrostatic Capacitances | 2.02 pF | 2.37 pF | 0.50 pF | 0.50 pF | 2.57 pF |

As illustrated in Tables 1 and 3, the anti-resonant frequencies of the parallel arm resonators p3a and p3b in the example are the same, whereas the anti-resonant frequencies of the parallel arm resonators p3a and p3b in comparative example 2 are different from each other.

3-1. Comparison of Example and Comparative Example 1

First, the bandpass characteristics of the filter devices of the example and comparative example 1 will be described and compared.

Figure 4:
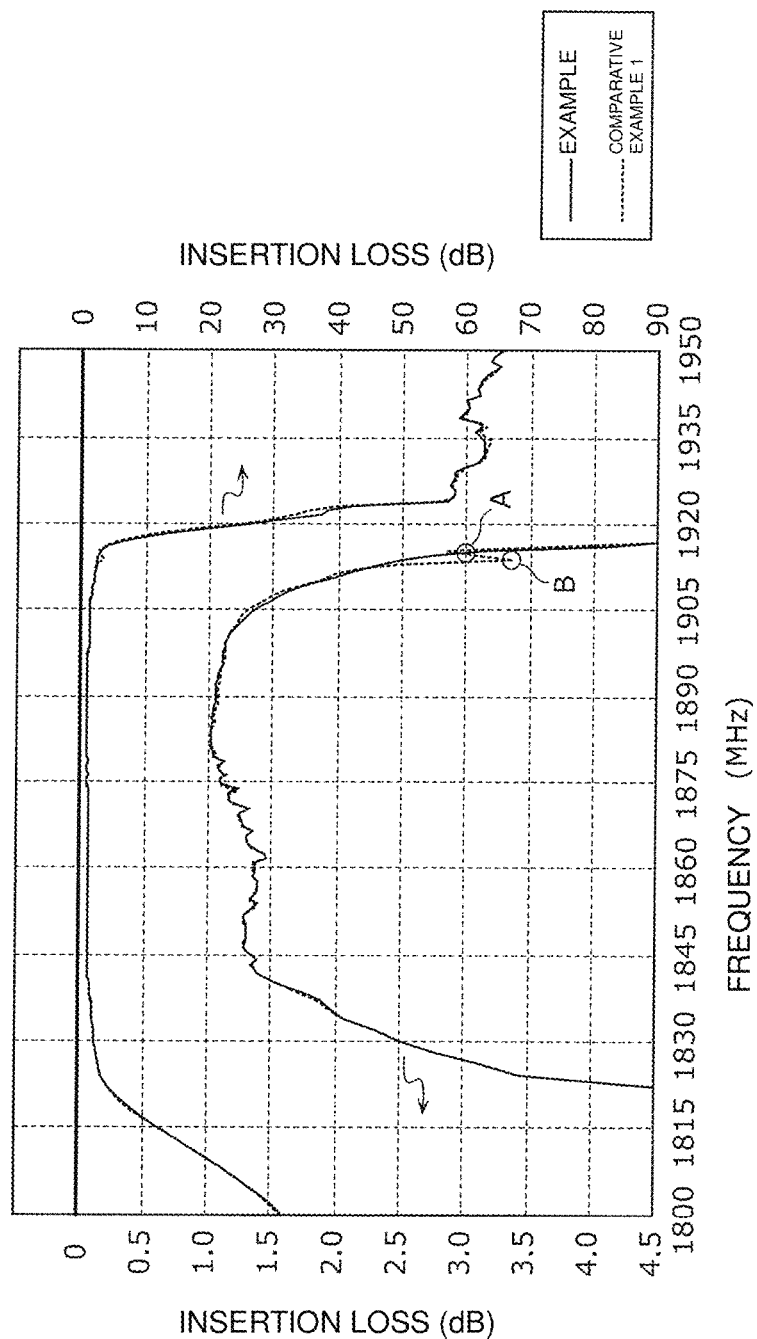
FIG. 4 is a graph illustrating the bandpass characteristics of filter devices of an example of a preferred embodiment of the present invention and comparative example 1.

FIG. 4 is a graph illustrating the bandpass characteristics of the filter devices of the example and comparative example 1. The solid line represents the bandpass characteristic of the filter device 1 of the example and the broken line represents the bandpass characteristic of the filter device 2 of comparative example 1.

As illustrated in FIG. 4, in Band 25Tx (about 1850 MHz—about 1915 MHz), the maximum insertion loss of the filter device 1 according to the example is about 3 dB as indicated by part A in FIG. 4 and the maximum insertion loss of the filter device 2 according to comparative example 1 is about 3.34 dB as indicated by part B in FIG. 4, and thus the insertion loss of the filter device 2 is degraded compared with the insertion loss of the filter device 1. Here, the mechanism responsible for the insertion loss of the filter device 1 being less degraded than the insertion loss of the filter device 2 will be described using FIG. 5.

Figure 5:
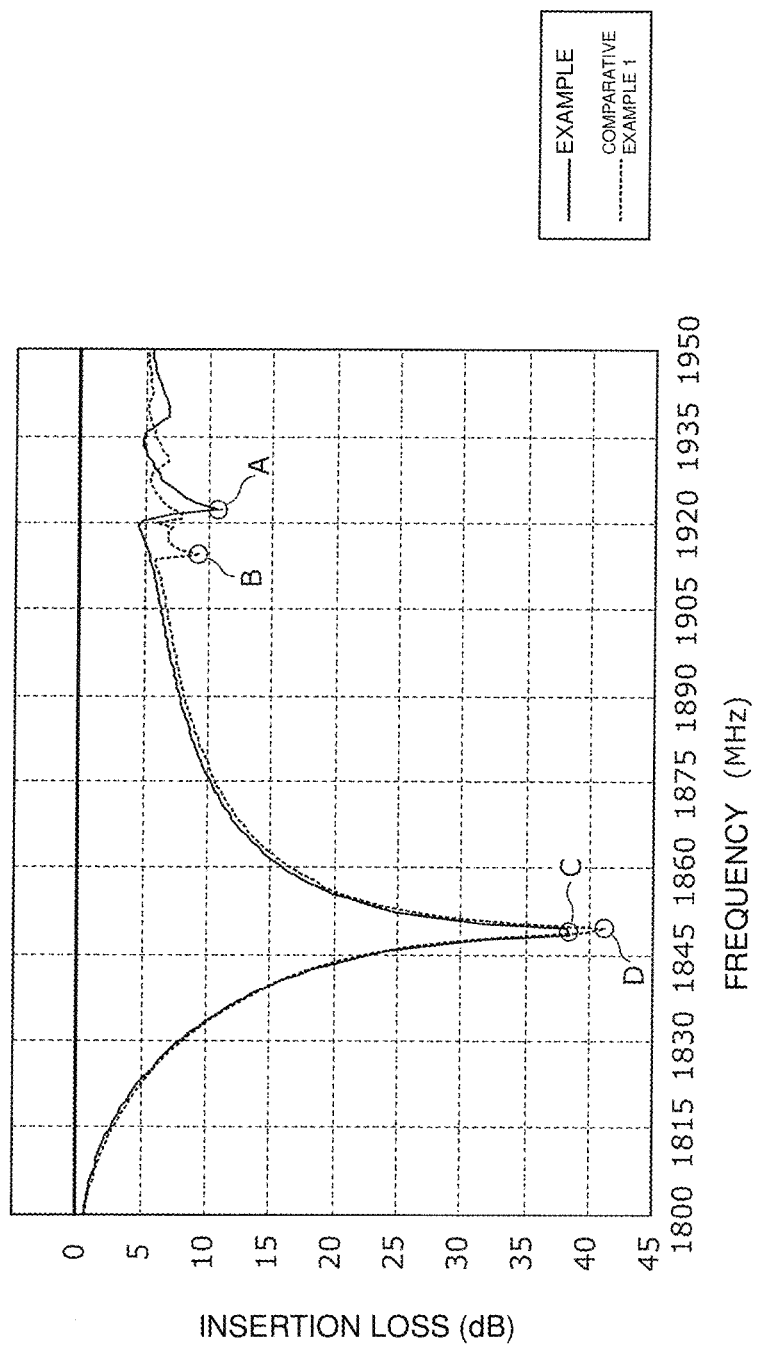
FIG. 5 is a graph illustrating the bandpass characteristics of the parallel arm resonators, as standalone units, having the lowest anti-resonant frequencies in the example and comparative example 1.

FIG. 5 is a graph illustrating the bandpass characteristics of the parallel arm resonators, as standalone units, having the lowest anti-resonant frequencies in the example and comparative example 1. The solid line represents the bandpass characteristic of a composite parallel arm resonator, as a standalone unit, including the parallel arm resonators p3a and p3b in the example and the broken line represents the bandpass characteristic of the parallel arm resonator p3 in comparative example 1 as a standalone unit.

A parallel arm resonator that utilizes SAWs causes a stop band ripple to be generated due to the characteristics thereof. For example, as illustrated in FIG. 5, the composite parallel arm resonator in the example causes a stop band ripple to be generated in part A in FIG. 5 and the parallel arm resonator p3 in comparative example 1 causes a stop band ripple to be generated in part B in FIG. 5.

As illustrated in Table 2, the anti-resonant frequencies of the parallel arm resonators p1, p2, p3, and p4 in comparative example 1 are different from each other. In this way, the pass band can be widened and a wide pass band such as, for example, Band 25Tx can be handled. When the anti-resonant frequencies of the parallel arm resonators p1, p2, p3, and p4 that define the pass band are made different from each other in order to widen the pass band, there will be a parallel arm resonator whose anti-resonant frequency is located on the low-frequency side of the pass band, a parallel arm resonator whose anti-resonant frequency is located on the high-frequency side of the pass band, and so on. The parallel arm resonator p3 has the lowest anti-resonant frequency and the anti-resonant frequency of the parallel arm resonator p3 is located on the low-frequency side of the pass band. The frequency at which the parallel arm resonator p3 causes a stop band ripple to be generated is also moved toward the low-frequency side in accordance with the amount by which the anti-resonant frequency of the parallel arm resonator p3 is moved toward the low-frequency side, and consequently, as illustrated in part B in FIG. 5, the parallel arm resonator p3 causes the stop band ripple to be generated near the high-frequency side of the pass band (near 1915 MHz). Therefore, as illustrated in part B in FIG. 4, the insertion loss is particularly degraded at the high-frequency side inside the pass band.

On the other hand, as illustrated in Table 1, the parallel arm resonators p1, p2, p3a (p3b), and p4 in the example have different anti-resonant frequencies from each other and the parallel arm resonators p3a and p3b are the parallel arm resonators that have the lowest anti-resonant frequencies and the anti-resonant frequencies of the parallel arm resonators p3a and p3b are located on the low-frequency side of the pass band. Therefore, the parallel arm resonators p3a and p3b can cause a stop band ripple to be generated near the high-frequency side of the pass band (near 1915 MHz). In this case, the parallel arm resonators p3a and p3b are designed as follows in order to move the frequency at which the stop band ripple is generated away from the pass band of the filter device 1 without greatly changing the bandpass characteristics of the filter devices 1 and 2 compared with the case where one parallel arm resonator p3 is connected to the connection node x3.

First, the sum of the numbers of pairs in the IDT electrodes of the parallel arm resonators p3a and p3b is equal to the number of pairs in the IDT electrode of the parallel arm resonator p3. Specifically, the numbers of pairs in the IDT electrodes of the parallel arm resonators p3a and p3b are each 43 pairs and the number of pairs in the IDT electrode of the parallel arm resonator p3 is 86 pairs. As a result, the electrostatic capacitances of the parallel arm resonators p3a and p3b are smaller and the anti-resonant frequencies of the parallel arm resonators p3a and p3b can be made low. Therefore, the anti-resonant frequencies of the parallel arm resonators p3a and p3b can be low while maintaining the same stop band ripple frequency compared with the parallel arm resonator p3. In other words, the gap between the anti-resonant frequency and the frequency of the stop band ripple can be widened.

Furthermore, the electrode pitches of the IDT electrodes of the parallel arm resonators p3a and p3b can be smaller than the electrode pitch of the IDT electrode of the parallel arm resonator p3. Thus, since the anti-resonant frequencies and the frequencies at which the stop band ripples are generated can be increased for the parallel arm resonators p3a and p3b, the anti-resonant frequencies can be maintained the same or substantially the same (i.e., the bandpass characteristic is not greatly changed) and the frequencies of the stop band ripples can be increased compared with the parallel arm resonator p3. It is clear that the anti-resonant frequencies of the composite parallel arm resonator (parallel arm resonators p3a and p3b) and the parallel arm resonator p3 are the same or substantially the same as illustrated in part C and part D in FIG. 5. In addition, as illustrated in part A and part B, it is clear that the frequency of the stop band ripple of the composite parallel arm resonator (part A) is higher than the frequency of the stop band ripple of the parallel arm resonator p3 (part B). Specifically, the frequency of the stop band ripple of the composite parallel arm resonator is higher than the high-frequency end of the pass band (for example, about 1915 MHz). Consequently, as illustrated in FIG. 4, the insertion loss of the filter device 1 of the example is less degraded than the insertion loss of the filter device 2 of comparative example 1 and the pass band of the filter device 1 is widened in the same or similar manner as the pass band of the filter device 2.

Thus, the frequency of the stop band ripple generated near the pass band of the filter device 1 can be shifted toward the high-frequency side, and therefore the pass band can be widened while reducing or preventing degradation of insertion loss.

Furthermore, the Q value at the anti-resonance point is more degraded in the example than in comparative example 1 as illustrated in part C and part D in FIG. 5. This is because, the number of pairs in each of the parallel arm resonators p3a and p3b in the example is smaller than the number of pairs in the parallel arm resonator p3 in comparative example 1, and the acoustic wave confinement effect is deteriorated. However, as illustrated in FIG. 4, the degradation of the Q value substantially does not affect the insertion loss in the example. This is due to the electrostatic capacitances of the parallel arm resonators p3a and p3b being smaller than the electrostatic capacitances of the other parallel arm resonators as illustrated in Table 1. Parallel arm resonators having a small electrostatic capacitance have a large impedance, and therefore the insertion loss in the pass band defined by the parallel arm resonators is improved. Therefore, even if the Q value at the anti-resonant frequency of a parallel arm resonator that is to improve the insertion loss is somewhat degraded, the effect of the deterioration of the Q value on the bandpass characteristic is not particularly visible. Thus, the smaller the electrostatic capacitances (i.e., the larger the impedances) of the parallel arm resonators p3a and p3b, the more the degradation of insertion loss can be reduced or prevented and the more the effect of the degradation of the Q values at the anti-resonant frequency can be reduced. Therefore, the effect of degradation of the Q values can be reduced by making the electrostatic capacitances of the parallel arm resonators p3a and p3b whose Q values are degraded at the anti-resonant frequency small.

In the present preferred embodiment, the parallel arm resonators p1, p2, and p4, excluding the parallel arm resonators p3a and p3b, are connected to different connection nodes provided along the path connected between the input/output terminal m1 and the input/output terminal m2. In other words, in the present preferred embodiment, other than the parallel arm resonators p3a and p3b, there are no other parallel arm resonators having a small number of pairs as a result of being divided in a parallel manner like the parallel arm resonators p3a and p3b. Therefore, although the Q values of a plurality of parallel arm resonators are degraded at the anti-resonant frequencies thereof when a plurality of parallel arm resonators are connected to the same connection node, in the present preferred embodiment, the number of parallel arm resonators whose Q values are degraded at the anti-resonant frequencies can be maintained small, and therefore the degradation of insertion loss can be effectively reduced or prevented.

3-2. Comparison of Example and Comparative Example 2

Next, the bandpass characteristics of the filter devices of the example and comparative example 2 will be described and compared.

Figure 6:
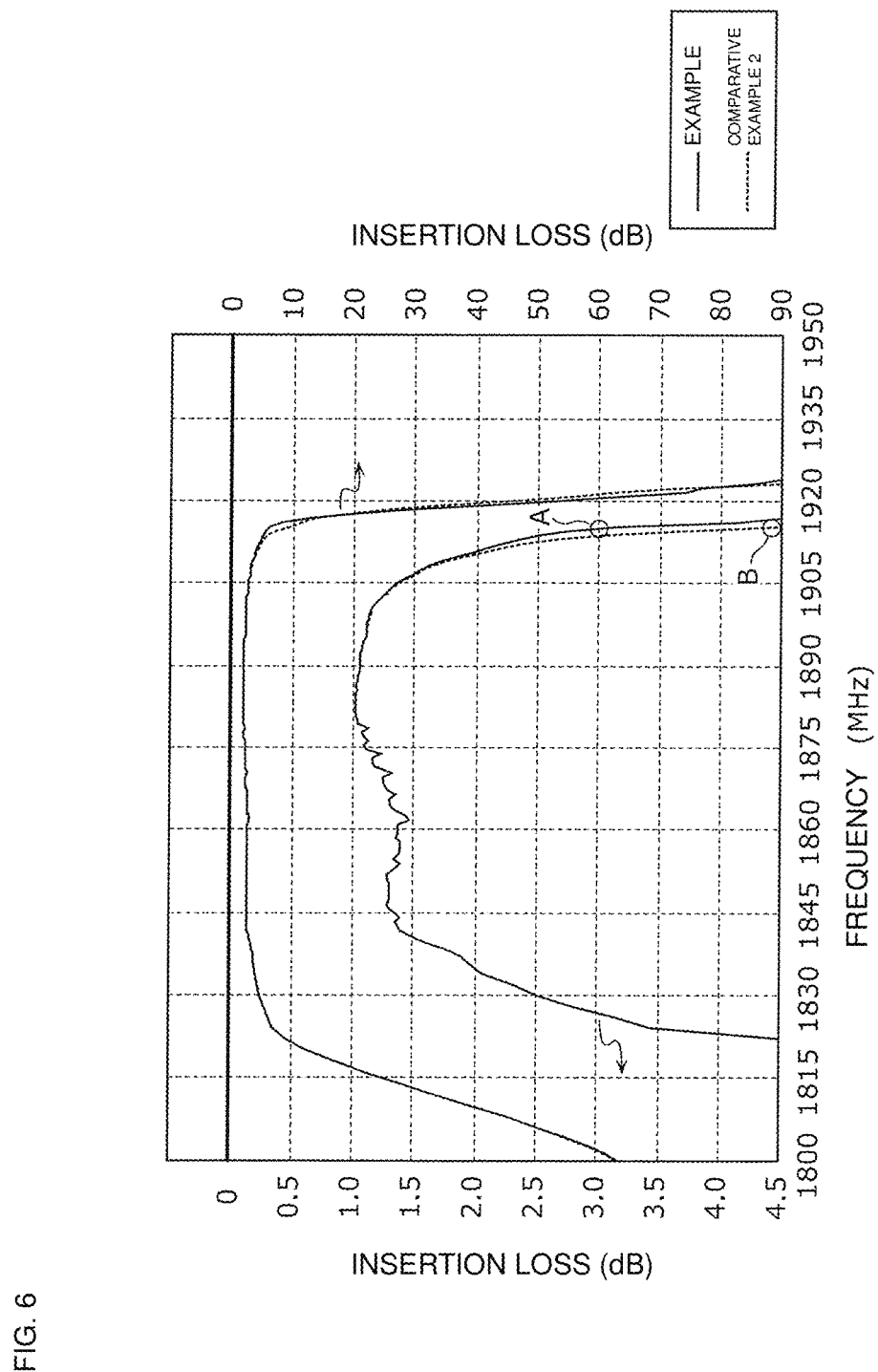
FIG. 6 is a graph illustrating the bandpass characteristics of filter devices of the example and a comparative example 2.

FIG. 6 is a graph illustrating the bandpass characteristics of the filter devices of the example and comparative example 2. The solid line represents the bandpass characteristic of the filter device 1 of the example and the broken line represents the bandpass characteristic of the filter device of comparative example 2.

As illustrated in FIG. 6, in Band 25Tx (about 1850 MHz—about 1915 MHz), the maximum insertion loss of the filter device 1 according to the example is about 3 dB as illustrated in part A in FIG. 6, the maximum insertion loss of the filter device according to comparative example 2 is about 4.46 dB, as illustrated in part B in FIG. 6, and thus the insertion loss of the filter device according to comparative example 2 is degraded compared with the insertion loss of the filter device 1. Here, the mechanism responsible for the insertion loss of the filter device 1 being less degraded than the insertion loss of the filter device of comparative example 2 will be described using FIG. 7.

Figure 7:
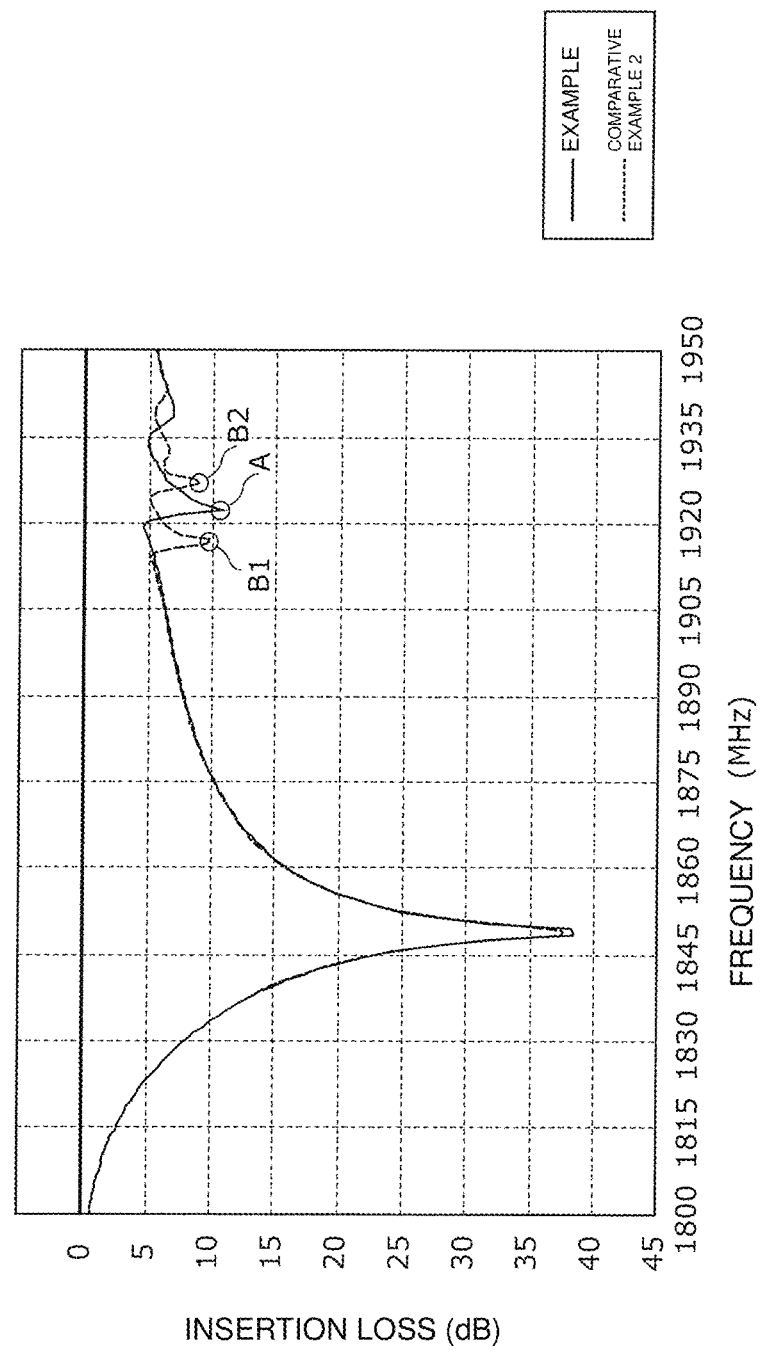
FIG. 7 is a graph illustrating the bandpass characteristics of the parallel arm resonators, as standalone units, having the lowest anti-resonant frequencies in the example and comparative example 2.

FIG. 7 is a graph illustrating the bandpass characteristics of the parallel arm resonators having the lowest anti-resonant frequencies in the example and comparative example 2. The solid line represents the bandpass characteristic of a composite parallel arm resonator consisting of the parallel arm resonators p3a and p3b in the example and the broken line represents the bandpass characteristic of a composite parallel arm resonator consisting of the parallel arm resonators p3a and p3b in comparative example 2.

In the case where the anti-resonant frequencies of the parallel arm resonators p3a and p3b are different from each other as in comparative example 2, it is necessary to make the anti-resonant frequency of one of the parallel arm resonators p3a and p3b (for example, parallel arm resonator p3a) lower than the anti-resonant frequency of the parallel arm resonator p3 and to make the anti-resonant frequency of the other parallel arm resonator (for example, parallel arm resonator p3b) higher than the anti-resonant frequency of the parallel arm resonator p3 in order to define the pass band in the same or similar manner as the parallel arm resonator p3. Thus, the frequency of the stop band ripple of the parallel arm resonator p3a in comparative example 2 illustrated in part B1 in FIG. 7 is lower than the frequency of the stop band ripple of the parallel arm resonators p3a and p3b in the example illustrated in part A in FIG. 7. In addition, the frequency of the stop band ripple of the parallel arm resonator p3b in comparative example 2 illustrated in part B2 in FIG. 7 is higher than the frequency of the stop band ripple of the parallel arm resonators p3a and p3b in the example illustrated in part A in FIG. 7.

Thus, the frequency of the stop band ripple generated by the parallel arm resonator p3a is lower in comparative example 2 and a stop band ripple is generated near the high-frequency side of the pass band. As a result, as illustrated in FIG. 6, the insertion loss of the filter device 1 of the example is less degraded than the insertion loss of the filter device of comparative example 2.

4. Multiplexer

The filter device 1 of the present preferred embodiment can be applied to a multiplexer according to a preferred embodiment of the present invention that is compatible with a system having a large number of usage bands.

Figure 8:
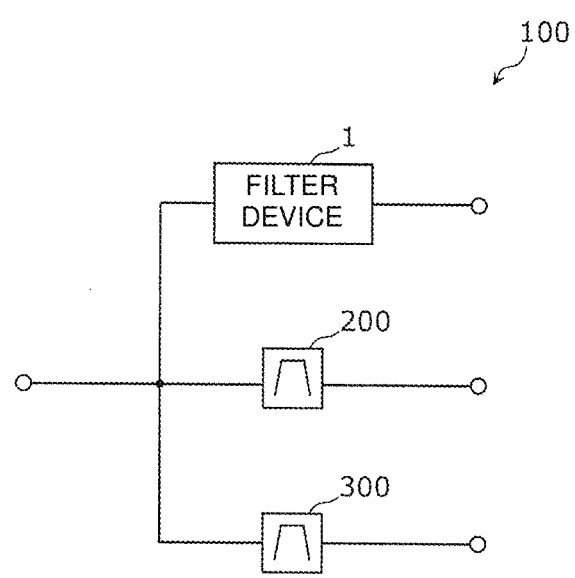
FIG. 8 is a circuit configuration diagram illustrating an example of a multiplexer according to a preferred embodiment of the present invention.

FIG. 8 is a circuit configuration diagram illustrating an example of a multiplexer 100 according to a preferred embodiment of the present invention.

As illustrated in FIG. 8, the multiplexer 100 includes a plurality of filters including the filter device 1, and one input/output terminal of each of the plurality of filters is directly or indirectly connected to a common point. For example, the multiplexer 100 includes the filter device 1 and filter devices 200 and 300, each including one input/output terminal that is connected to a common point.

The filters 200 and 300 may be, for example, band-pass filters, high-pass filters, low-pass filters, band-elimination filters, and so forth, but are not particularly limited. In addition, in this case, the multiplexer 100 is illustrated as a triplexer, but the multiplexer 100 may instead be a duplexer, a quadplexer, or the like, and the number of filters that are connected to a common point is not particularly limited. For example, carrier aggregation (CA) is performed when two or more filters among the filter device 1 and the filters 200 and 300 of the multiplexer 100 are used simultaneously.

Thus, a multiplexer that is capable of achieving a wider bandwidth while reducing or preventing degradation of insertion loss can be provided by including the filter device 1 in the multiplexer 100.

The filter device 1 and the multiplexer 100 have been described above as preferred embodiments of the present invention, but the present invention is not limited to these preferred embodiments. Other preferred embodiments obtained by combining any of the elements of the above-described preferred embodiments, modifications obtained by modifying the above-described preferred embodiments in various ways, as thought of by one skilled in the art, while not departing from the gist of the present invention, and various devices that include the filter device 1 and the multiplexer 100 of preferred embodiments of the present invention built thereinto are included in the scope of the present invention.

For example, in the above-described preferred embodiments, the filter device 1 includes eleven series arm resonators, but it is sufficient that the filter device 1 include at least 1 series arm resonator. Furthermore, the filter device 1 includes 5 parallel arm resonators but it is sufficient that the filter device 1 include at least 3 parallel arm resonators. For example, the filter device 1 may include the series arm resonator s5 and the parallel arm resonators p2, p3a and p3b as a minimum.

In addition, for example, in the above-described preferred embodiments, the parallel arm resonators other than the parallel arm resonators p3a and p3b are connected to different connection nodes from each other, but the present invention is not limited to this configuration. For example, in addition to the parallel arm resonators p3a and p3b, two or more parallel arm resonators may be connected to the same connection node as each other. For example, a parallel arm resonator connected in parallel with the parallel arm resonator p2 may be connected to the connection node x2.

In addition, for example, the electrostatic capacitances of the parallel arm resonators p3a and p3b are smaller than the electrostatic capacitances of the other parallel arm resonators in the above-described preferred embodiments, but the present invention is not limited to this configuration. In other words, the filter device 1 may include a parallel arm resonator having a smaller electrostatic capacitance than the parallel arm resonators p3a and p3b.

Furthermore, for example, in the above-described preferred embodiments, the filter device 1 is a ladder filter, but the present invention is not limited to this configuration. For example, the filter device 1 may be configured such that a combination of a ladder filter and a longitudinal coupling filter is used. However, in a ladder filter, a large number of parallel arm resonators are often connected to each other and the anti-resonant frequencies of the large number of parallel arm resonators are different from each other in order to widen the pass band. Therefore, if the present invention is applied to a ladder filter, the anti-resonant frequencies of some of the large number of parallel arm resonators are likely to become smaller, and the effect achieved when applying the present invention will be more apparent.

Preferred embodiments of the present invention can be widely used in communication devices such as, for example, mobile phones as a filter device and a multiplexer that can be applied to a multi-band system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device that utilizes surface acoustic waves, the filter device comprising:
one or more series arm resonators that are connected to each other along a path connected between a first input/output terminal and a second input/output terminal; and
three or more parallel arm resonators that are each connected between a connection node provided on the path and ground and that define the pass band of the filter device; wherein
the three or more parallel arm resonators include parallel arm resonators having different anti-resonant frequencies from each other;
two or more parallel arm resonators among the three or more parallel arm resonators are connected to a same connection node provided along the path;
remaining parallel arm resonators among the three or more parallel arm resonators are connected to connection nodes that are different from the same connection node; and
the anti-resonant frequencies of the two or more parallel arm resonators are identical or substantially identical and are lowest anti-resonant frequencies among the anti-resonant frequencies of the three or more parallel arm resonators.

2. The filter device according to claim 1, wherein the remaining parallel arm resonators include two or more parallel arm resonators and the two or more parallel arm resonators among the remaining parallel arm resonators are connected to different connection nodes provided along the path.

3. The filter device according to claim 1, wherein electrostatic capacitances of the two or more parallel arm resonators connected to the same connection node are smaller than electrostatic capacitances of the remaining parallel arm resonators.

4. The filter device according to claim 1, wherein the one or more series arm resonators and the three or more parallel arm resonators define a ladder filter.

5. The filter device according to claim 1, wherein
each resonator of the one or more series arm resonators and the three or more parallel arm resonators includes an IDT electrode including a pair of comb-shaped electrodes provided on a substrate including a piezoelectric layer; and
the substrate includes:
a piezoelectric layer including the IDT electrode provided on one main surface thereof;
a high-acoustic-velocity support substrate in which an acoustic velocity of a propagating bulk wave is higher than an acoustic velocity of an acoustic wave propagating along the piezoelectric layer; and
a low-acoustic-velocity film between the high-acoustic-velocity support substrate and the piezoelectric layer and in which an acoustic velocity of a propagating bulk wave is lower than an acoustic velocity of a bulk wave propagating along the piezoelectric layer.

6. The filter device according to claim 1, wherein none of the remaining parallel arm resonators is connected to a same connection node.

7. The filter device according to claim 5, wherein each of the resonators of the one or more series arm resonators and the three or more parallel arm resonators further include a protective layer covering the IDT electrode.

8. The filter device according to claim 5, wherein each of the IDT electrodes has a multilayer structure including an adhesive layer and a main electrode layer.

9. The filter device according to claim 8, wherein the adhesive layer is made of Ti.

10. The filter device according to claim 8, wherein the main electrode layer is made of Al including about 1% Cu.

11. A multiplexer comprising:
a plurality of filters including the filter device according to claim 1;
wherein one input/output terminal of each of the plurality of filters is directly or indirectly connected to a common connection point.

12. The multiplexer according to claim 11, wherein the remaining parallel arm resonators include two or more parallel arm resonators and the two or more parallel arm resonators among the remaining parallel arm resonators are connected to different connection nodes provided along the path.

13. The multiplexer according to claim 11, wherein electrostatic capacitances of the two or more parallel arm resonators connected to the same connection node are smaller than electrostatic capacitances of the remaining parallel arm resonators.

14. The multiplexer according to claim 11, wherein the one or more series arm resonators and the three or more parallel arm resonators define a ladder filter.

15. The multiplexer according to claim 11, wherein
each resonator of the one or more series arm resonators and the three or more parallel arm resonators includes an IDT electrode including a pair of comb-shaped electrodes provided on a substrate including a piezoelectric layer; and
the substrate includes:
a piezoelectric layer including the IDT electrode provided on one main surface thereof;
a high-acoustic-velocity support substrate in which an acoustic velocity of a propagating bulk wave is higher than an acoustic velocity of an acoustic wave propagating along the piezoelectric layer; and
a low-acoustic-velocity film that between the high-acoustic-velocity support substrate and the piezoelectric layer and in which an acoustic velocity of a propagating bulk wave is lower than an acoustic velocity of a bulk wave propagating along the piezoelectric layer.

16. The multiplexer according to claim 11, wherein none of the remaining parallel arm resonators is connected to a same connection node.

17. The multiplexer according to claim 15, wherein each of the resonators of the one or more series arm resonators and the three or more parallel arm resonators further include a protective layer covering the IDT electrode.

18. The multiplexer according to claim 15, wherein each of the IDT electrodes has a multilayer structure including an adhesive layer and a main electrode layer.

19. The multiplexer according to claim 18, wherein the adhesive layer is made of Ti.

20. The multiplexer according to claim 18, wherein the main electrode layer is made of Al including about 1% Cu.

* * * * *